United States Patent [19]
Fan et al.

[11] Patent Number: 5,931,512
[45] Date of Patent: Aug. 3, 1999

[54] LATCH MECHANISM FOR WAFER CONTAINER

[75] Inventors: Horng-Kuang Fan; Jyhjone Lee; Gwo-Jou Huang, all of Hsinchu, Taiwan

[73] Assignee: Industrial Technology Research Institute, Hsinchu, Taiwan

[21] Appl. No.: 08/898,879

[22] Filed: Jul. 23, 1997

[51] Int. Cl.[6] .................................................. E05C 5/00
[52] U.S. Cl. .................................. 292/66; 292/7; 292/48
[58] Field of Search ................................ 292/24, 26, 27, 292/44, 96–98, 196, 197, 48, 63, 66, 109, 7; 220/244, 247, 248, 324, 329

[56] References Cited

U.S. PATENT DOCUMENTS

| | | | |
|---|---|---|---|
| 1,047,900 | 12/1912 | Voight | 292/47 |
| 1,092,289 | 4/1914 | Reese | 220/248 |
| 1,269,572 | 6/1918 | Allenbaugh | 292/37 |
| 2,140,570 | 12/1938 | Young | 297/47 |
| 2,315,239 | 3/1943 | Young | 292/47 |
| 4,754,715 | 7/1988 | Squires et al. | 109/59 T |
| 4,893,849 | 1/1990 | Schlack | 292/66 |
| 4,964,755 | 10/1990 | Lewis et al. | 292/66 |

FOREIGN PATENT DOCUMENTS

| | | | |
|---|---|---|---|
| 2152 | of 1866 | United Kingdom | 109/59 |
| 1026 | of 1869 | United Kingdom | 109/59 |
| 1399 | of 1869 | United Kingdom | 109/59 |
| 149569 | 8/1920 | United Kingdom | 292/57 |

*Primary Examiner*—Steven Meyers
*Assistant Examiner*—Teri Pham
*Attorney, Agent, or Firm*—W. Wayne Liauh

[57] ABSTRACT

A latch mechanism for a wafer container includes a box sealable to a base plate to form an air-tight space for holding at least one wafer therein. The latch mechanism is located on the base plate and includes a U-shaped latch plate and a cam mechanism. The latch plate has a hook member at a front end thereof. The hook member includes a 7-shape hook with a bottom end pivotly engaged with the base plate and a top end pivotly engaged with the front end of the latch plate. The cam mechanism includes a cam and a linkage bar with a roller disposed therein. One end of the linkage bar attached to the latch plate. Another end of the linkage bar has a pin engaging with a slot formed in the cam. The pin and the roller form a positive and movable engagement with the cam. By turning the cam, the linkage bar and latch plate will have linear motion and trigger the hook to engage the box securely to the base plate or allow the box disengaging with the base plate. The cam has bulges on the circumference and are engageable with the roller for preventing the cam from counter rotating.

7 Claims, 5 Drawing Sheets

LATCH MECHANISM FOR WAFER CONTAINER

BACKGROUND OF THE INVENTION

1. Field of the Invention

This invention relates to a latch mechanism used in a wafer container to provide sealed housing space for the transport or storage of a wafer container, and particularly to a latch mechanism for clamping the box of the wafer container tightly to the base plate of the wafer container for providing air-tight sealing.

2. Description of the Prior Art

During wafer fabricating processes, in order to prevent the wafer from contamination of particles in ambient atmosphere, the wafer is usually held in a completely sealed container.

U.S. Pat. No. 4,995,430 disclosed a sealable transportable container for such purpose. It includes a box sealable to a bottom wall by a latch mechanism located on the bottom wall. The latching is accomplished by means of a cam mechanism actuating a latch plate to move linearly so that a latch finger at one end thereof can engage with a latch engaging surface of the box. A riser is provided on the roller surface of the cam mechanism for providing pivoting motion of the latch plate so that the finger end of the latch plate can press the box tightly against the bottom wall when the cam mechanism is turned to a required position.

However in the event of no anti-counter rotation positioning means being provided, or the cam mechanism not being turned to the required position (e.g. being turned only to one half of the angle required), the vibration and impact forces resulting from handling or transportation of the box, and the compressing force applied on the latch plate caused by the riser can cause the cam mechanism to produce counter rotation and consequently resulting in the box being separately from the bottom wall. Furthermore, the cam mechanism disclosed in the U.S. Pat. No. 4,995,430 includes pivot post, pins, slots, cam lobes, slant camming surface, springs, etc. It is a complex structure composed of a lot of components. It is therefore expensive to produce.

SUMMARY OF THE INVENTION

In view of aforesaid disadvantages, it is an object of this invention to provide a latch mechanism for a wafer container by which the box can be secured tightly on the base plate. The cam mechanism will not produce counter rotation even when the latching mechanism is not being rotated to a required position. The cam mechanism is simply structured with a small number of components, and thus is easy to produce and is a low cost.

It is another object of this invention to provide a latch mechanism for a wafer container for latching the box securely to the base plate. The latch mechanism according to this invention includes a U-shape latch plate and a cam mechanism. There is a 7-shaped hook pivotly engaged with the base plate at a bottom end and pivotly engaged at a top end thereof with a front end of the latch plate via a spindle. The cam mechanism includes a cam and a linkage bar. The linkage bar has one end engaging with the latch plate while another end movably engaging with the cam. When the cam is turned and moves the linkage bar linearly inward, the latch plate will also be moved linearly inward to a first position, the hook will be withdrawn and allowing the box to separate from the base plate. When the cam is turned in another direction, the linkage bar and the latch plate will be moved linearly outward, and the hook will be moved to a second position for clamping the box tightly to the base plate. The latching and clamping is securely achieved even when the cam is not being turned to a designated position. There is also no risk of counter-rotation of the cam mechanism.

BRIEF DESCRIPTION OF THE DRAWINGS

The invention, as well as its many advantages, may be further understood be the following detailed description and drawings in which.

DETAILED DESCRIPTION OF THE PREFERRED EMBODIMENT

Figure 1:
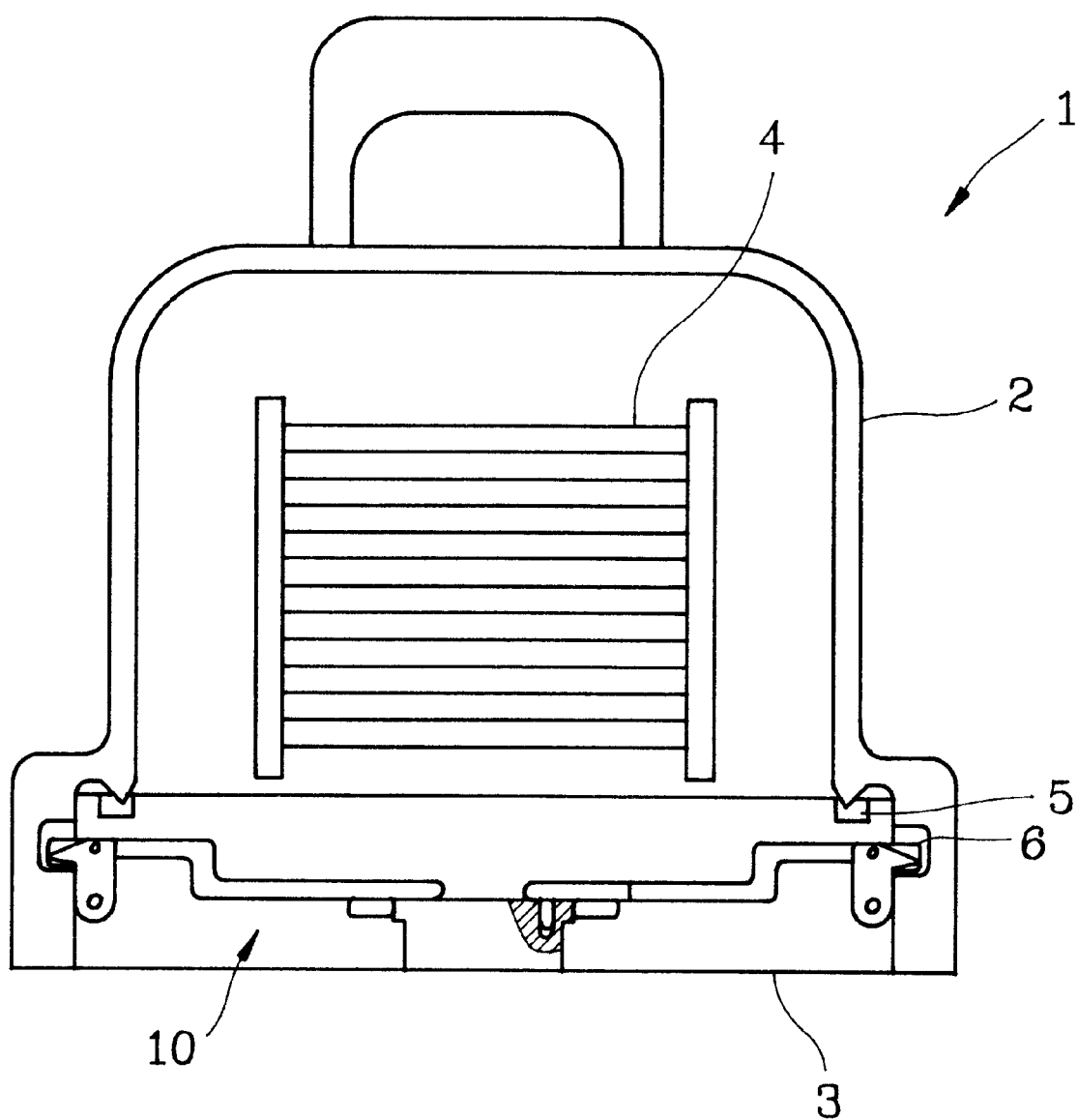
FIG. 1 is a schematic picture of this invention.

Referring to FIG. 1, a wafer container 1 includes a box 2 mounted on a base plate 3. Inside the box 2, there is a plural number of wafers 4 being held. A latch mechanism 10 is located on the base plate 3. The bottom rim of the box 2 has a plural number of recesses 6 for the latch mechanism 10 to securely latch and engage therein. A gasket 5 is located between the box 2 and the base plate 3 to provide air-tight sealing for the container.

Figure 2:
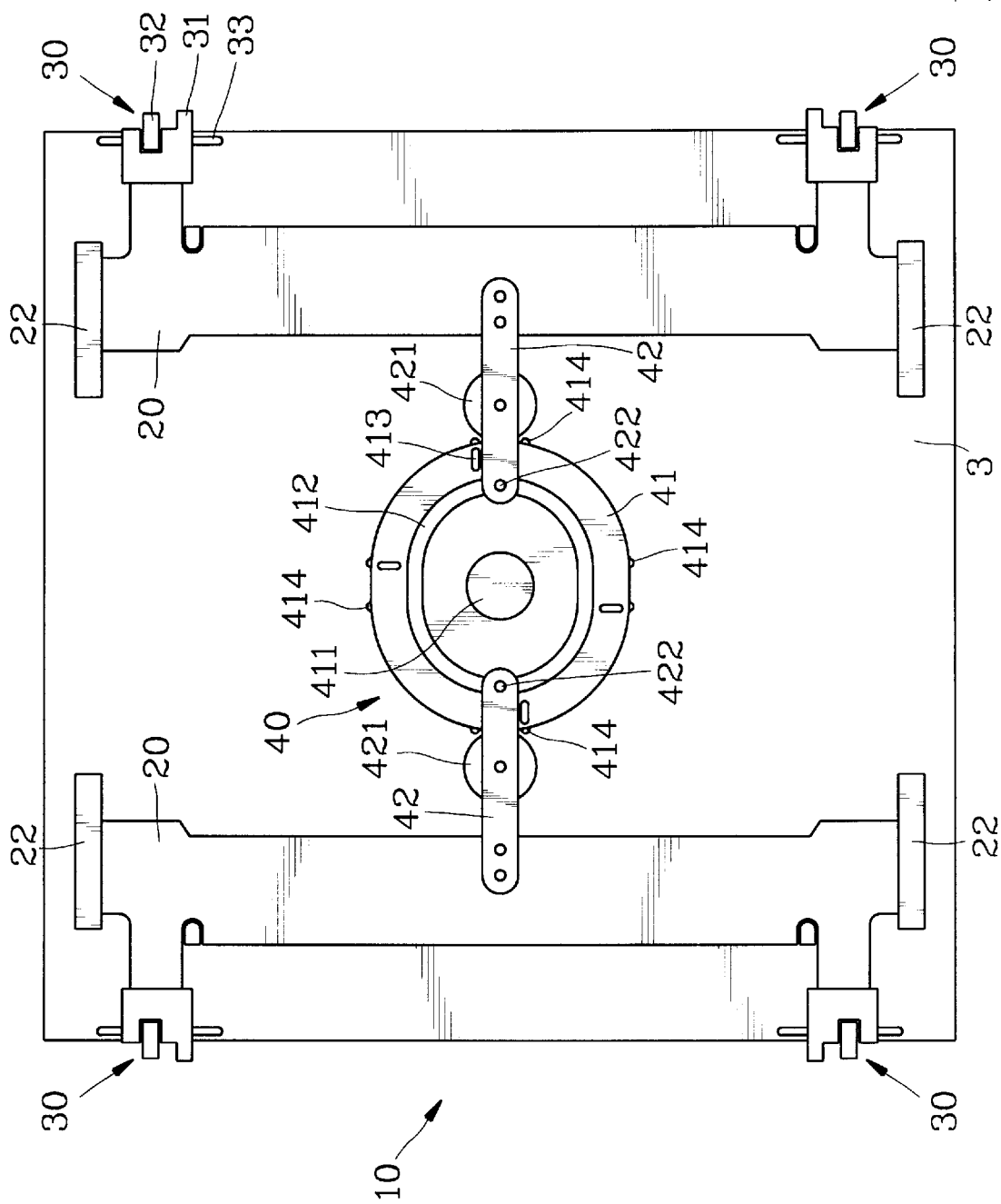
FIG. 2 is a bottom view of a latching mechanism with a latch plate at a second position.
Figure 6:
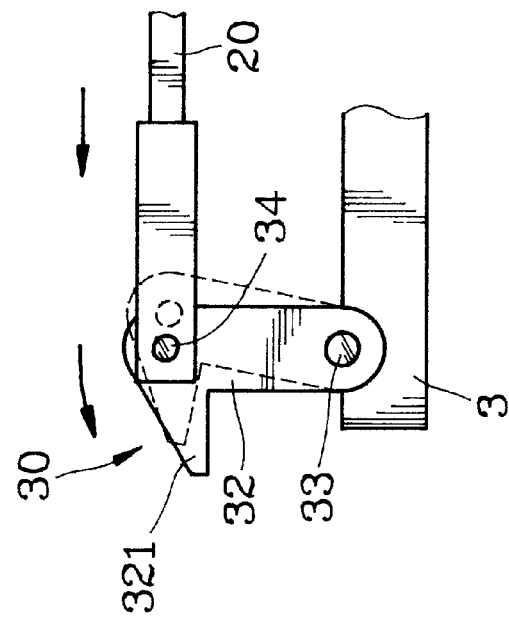
FIG. 6 is a side view of a hook means schematically showing movements of the hook means.
Figure 5:
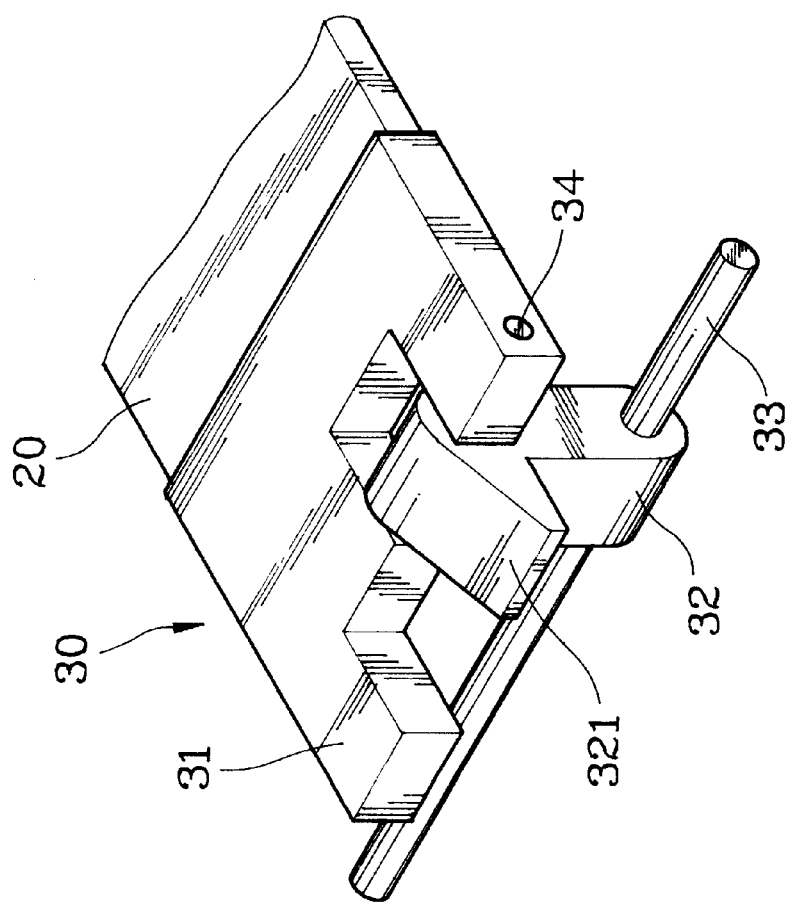
FIG. 5 is a partially enlarged perspective view of a hook means.

Referring to FIG. 2, the latch mechanism 10 includes a pair of spaced latch plate 20 and a cam mechanism 40. Each latch plate 20 is a substantially U-shaped member slideable linearly along a pair of guide rails 22 located at two ends thereof. Each latch plate 20 further has a pair of spaced hook means 30 as shown in FIG. 5 and 6. The hook means 30 includes a hook body 32 which is a 7-shape member pivotly engaged at a bottom end with the base plate 3 via a first spindle 33, while the top end thereof is pivotly engaged with one end of the latch plate 20 via a second spindle 34. The hook body 32 has a protrusive beak 321 while the front end of the latch plate 20 has a protrusive lug 31 which extends about the same horizontal distance as that of the beak 321.

Figure 4:
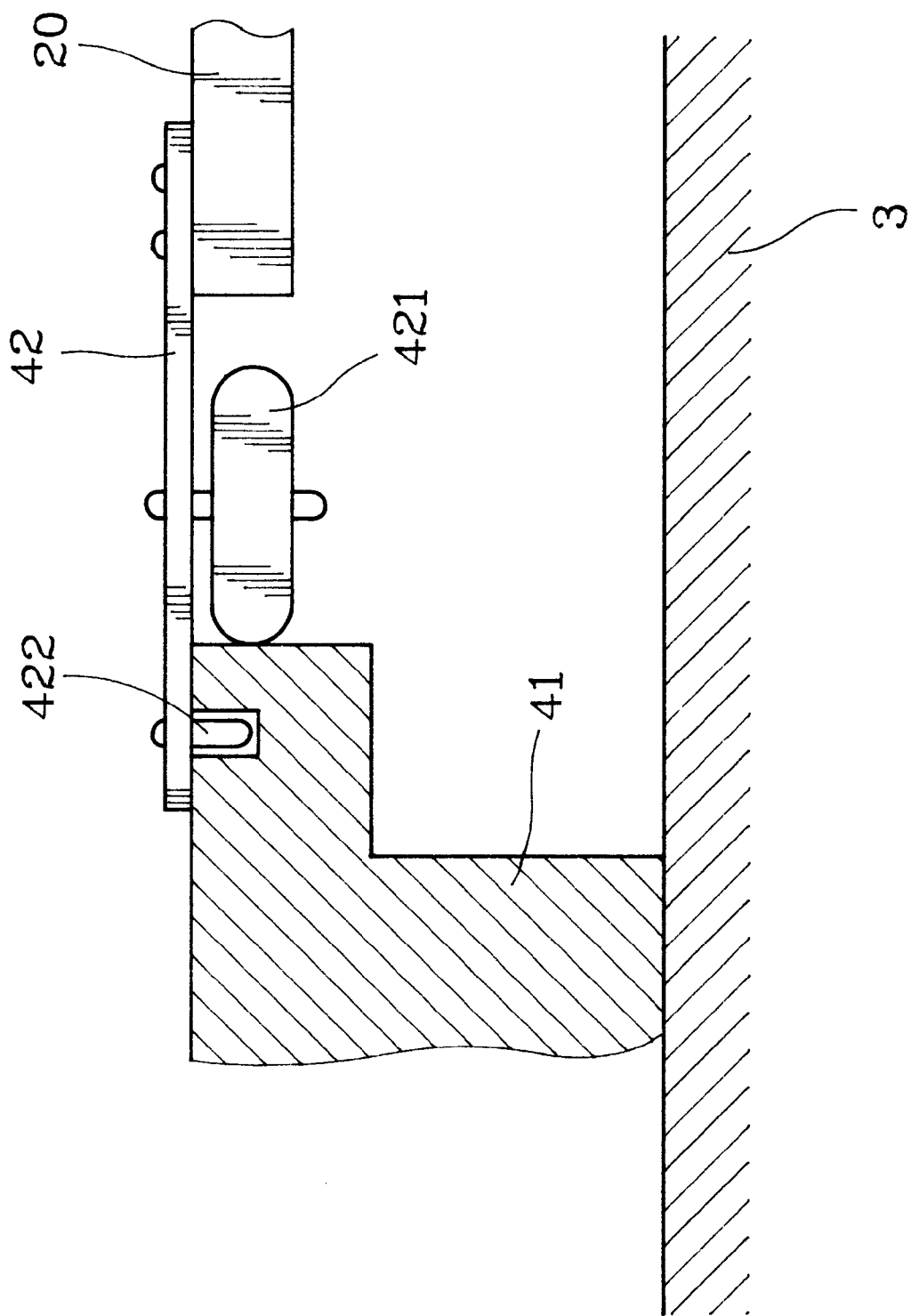
FIG. 4 is a fragmentary side view of a cam mechanism.

Referring to FIGS. 2 and 4, the cam mechanism 40 includes a cam 41, a curved slot 412, a roller 421, a pin 422 and a linkage bar 42 which has one end attached to the latch plate 20 in the middle portion. The curved slot 412 is formed a completed guide path along the perimeter of the cam 41. The pin 422 is fixed to another end of the linkage bar 42 and is slideable in the slot 412. On the cam surface, there is a plural number of spaced stoppers 413 which when hitting the linkage bar 42 will prevent the cam from turning continuously. On the perimeter of cam 41, there are further a plural number of spaced bulges 414 which can slidably engage with the roller 421 for preventing the cam 41 from counter rotating. Because of pin 422 and roller 421, when the cam 41 is turned, the linkage bar 42 and the latch plate 20 will be moved linearly.

Figure 3:
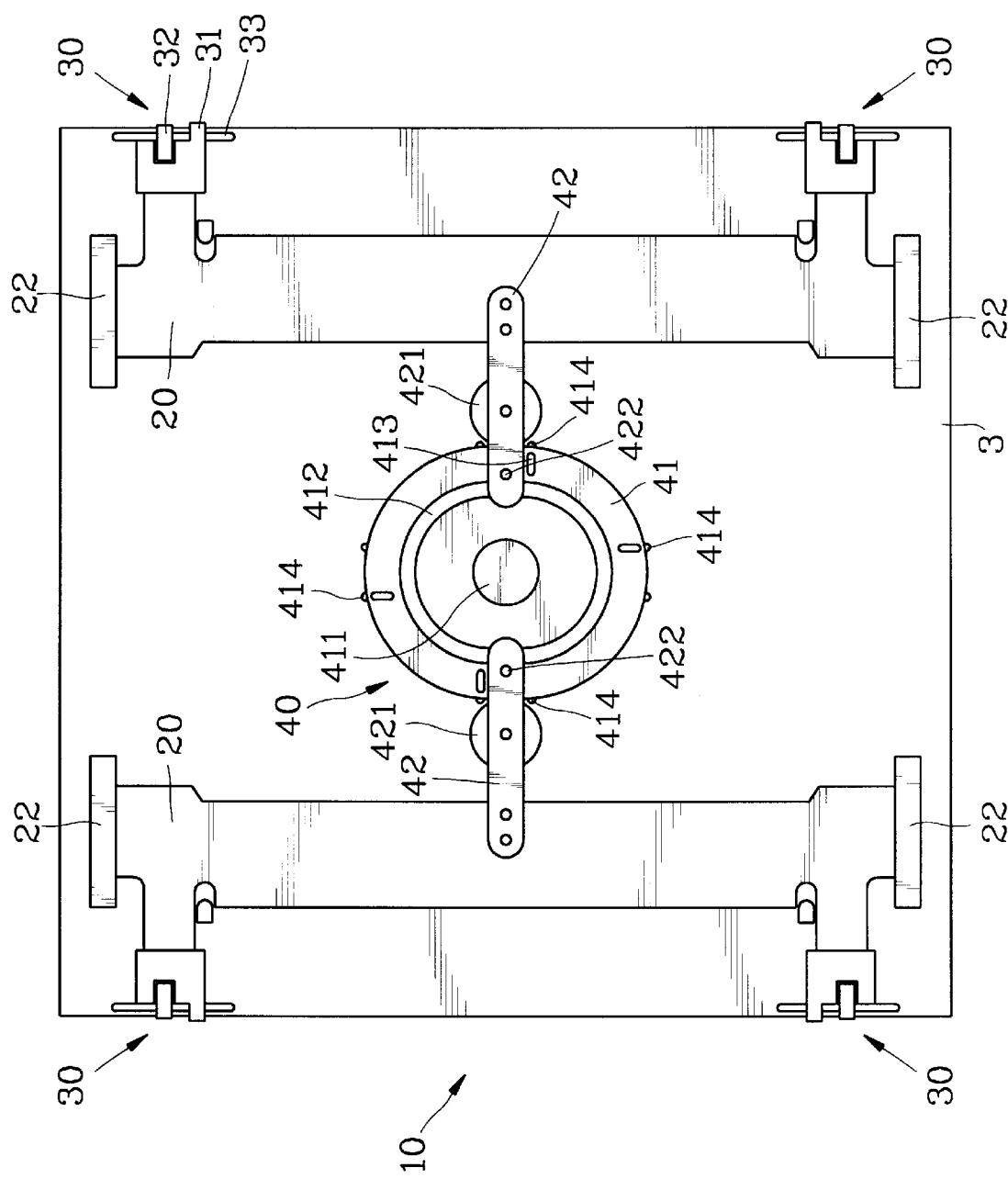
FIG. 3 is a bottom view of a latching mechanism with a latch plate at a first position.

Referring to FIGS. 2, 3 and 6, when the cam 41 is turned, the axle 411 latch plate 20 will be moved to the first position (shown in FIG. 3), the beak 321 and the lug 31 will be pulled inward to allow the box 2 and the base plate 3 disengaged (also shown by broken line in FIG. 6). One stopper 413 hits the linkage bar 42 to prevent the cam 41 from over rotation, while a pair of bulges 414 wedge the roller 421 between them for preventing the cam 41 from counter-rotating.

When the cam 41 is turned in another direction and reaches the second position (as shown in FIG. 2), the latch plate 20 will be moved outward, the lug 31 and the beak 321 will latch and engage with the recess 60 formed in a bottom rim of the box 2 (also shown in FIG. 1), and thus hold the box 2 and the base plate 3 together. The swinging of the hook 32 (shown in FIG.6, from broken line position to solid line position) further enables the beak 321 to produce a downward pressure against the rim of the box, therefore the box 2 will be tightly held against the base plate 3 to produce an air-tight sealing effect. Again, another stopper 413 will hit the linkage bar 42 for preventing the cam 41 from over-turning, while another pair of bulges 413 wedge the roller 421 between them for preventing the cam 41 from counter-rotating.

It is noted that following illustrated embodiments have in general similar structure like the one shown in FIG. 2. Therefore same numerals are used for similar type of elements.

It may thus be seen that the lug 31 and hook 32 of this invention can effectively engage the box on the base plate. Even when the cam is not fully turned to the designated position, the lug can still engage within the recess of the box securely. The bulges can prevent the cam from counter-rotating. The whole structure is simple, and with small number of components. It is thus easy and low cost to produce.

What is claimed is:

1. A latch mechanism for use with a wafer container, said wafer container having a base plate and a box sealable to the base plate for forming an air-tight space to house at least one wafer therein, and said latch mechanism comprising:

a latch plate including at least one hook means engageable with a box of a wafer container, the hook means having a hook, the hook having its bottom end pivotly engageable with a base plate of the wafer container and a top end thereof pivotly engaged with a front end of said latch plate; and a cam mechanism including a cam and a linkage bar, the linkage bar having one end fixedly engaged with the latch plate in a middle portion and another end thereof movably engaging with said cam;

wherein, by turning the cam in one direction, said latch plate will be moved to a first position such that a front end of said hook together with said front end of said latch plate will be withdrawn to disengage the box from the base plate; and by turning said cam in another direction, said latch plate will be moved to a second position such that said front ends of said hook and said latch plate will be extended forward to engage the box firmly to the base plates;

further wherein said latch plate is formed in a substantially U-shape and has a pair of spaced protrusive lugs at a front end thereof engageable with a plurality of recesses formed in the box at said second position.

2. The latch mechanism for use with a wafer container of claim 1, which further includes a pair of spaced guide rails located at both lateral ends of said latch plate for guiding said latch plate to move linearly.

3. The latch mechanism for use with a wafer container of claim 1, wherein the cam mechanism has a curved slot formed in the cam along the perimeter of the cam at a constant distance with the perimeter, a roller located on the linkage bar contactable with the perimeter of the cam, and a pin fixedly located at another end of the linkage bar engageable with the curved slot such that when the cam is turned, the linkage bar will be moved linearly and axially to move the latch plate linearly.

4. The latch mechanism for use with a wafer container of claim 3, further having a plurality of stoppers on the cam, wherein one stopper hits the linkage bar when the latch plate reaches the first position and prevents the cam from further turning in one direction, and another stopper hits the linkage bar when the latch plate reaches the second position and prevent the cam from turning further in another direction.

5. The latch mechanism for use with a wafer container of claim 4, wherein the cam has a plurality of spaced bulges formed on the circumference thereof, the bulges are engageable with the roller and allow the cam to be turnable when an external force is applied on the cam for preventing the cam from counter-rotating when the latch plate is moved to the first or second position.

6. A wafer container with a latch mechanism, comprising a latch mechanism and a box sealable to a base plate for forming an air-tight space to house at least one wafer therein, the box having a plural number of recesses formed in a bottom rim thereof, and said latch mechanism being located on the base plate and comprising:

a U-shaped latch plate having a pair of spaced hook means located at a front end thereof, the hook means including a hook member having a bottom end pivotly engaged with the base plate and a top end pivotly engaged with the latch plate; and a cam mechanism including a cam, a linkage bar, a curved slot, a roller and a pin;

the linkage bar having one end fixedly engaged with a middle portion of the latch plate and another end fixedly engaged with the pin, the roller located on the linkage bar contactable with the circumference of the cam, the pin slidably engageable with the curved slot which is formed in the cam along the perimeter thereof such that when the cam is turned, the linkage bar will move the latch plate linearly between a first position and a second position, wherein the box is disengaged with the base plate at the first position resulting from the hook and a front end of the latch plate being withdrawn, and the box is engaged firmly with the base plate at the second position resulting from the hook and the front end of the latch plate engaging with the box at the recesses.

7. The wafer container with a latch mechanism of claim 6, wherein the cam has a plural number of stoppers and bulges for positioning of the cam.

* * * * *